United States Patent
Nomoto et al.

(10) Patent No.: US 8,378,264 B2
(45) Date of Patent: Feb. 19, 2013

(54) HEATER FOR PIPING

(75) Inventors: Tsuguhiro Nomoto, Komae (JP);
Hiroaki Murayama, Komae (JP);
Kazuhisa Miyazaki, Komae (JP)

(73) Assignee: Tokyo Technological Labo Co., Ltd., Komae-Shi (Tokyo) (JP)

( * ) Notice: Subject to any disclaimer, the term of this patent is extended or adjusted under 35 U.S.C. 154(b) by 317 days.

(21) Appl. No.: 12/809,422

(22) PCT Filed: Dec. 21, 2007

(86) PCT No.: PCT/JP2007/074645
§ 371 (c)(1),
(2), (4) Date: Jul. 26, 2010

(87) PCT Pub. No.: WO2009/081466
PCT Pub. Date: Jul. 2, 2009

(65) Prior Publication Data
US 2011/0163081 A1    Jul. 7, 2011

(51) Int. Cl.
*F27D 11/00* (2006.01)
(52) U.S. Cl. ........................................ 219/385
(58) Field of Classification Search .................... 219/385
See application file for complete search history.

(56) References Cited

FOREIGN PATENT DOCUMENTS

| JP | 59-34791 Y | 9/1984 |
|---|---|---|
| JP | 09-017555 | 1/1997 |
| JP | 10-134947 | 5/1998 |
| JP | 10-275676 Y | 10/1998 |
| JP | 2001-41350 Y | 2/2001 |
| JP | 2006-144942 Y | 6/2006 |

*Primary Examiner* — David S Blum
(74) *Attorney, Agent, or Firm* — Lucas & Mercanti, LLP

(57) ABSTRACT

A heater for piping includes a plurality of shells connected via hinges. The shells are adapted to be mounted on an outer circumferential wall of piping having a circular cross section to enclose the piping and form a polyhedron along the piping. Thermal insulators are disposed over entire surfaces of inner walls of the shells. A plurality of molds are disposed at the inner walls and are adapted to abut on the outer circumferential wall of the piping in the mounted state. A plurality of heating elements are disposed at the inner walls of the shells so that the heating elements are positioned in a space formed between corners of the polyhedron and the outer circumferential wall of the piping and extend in the longitudinal direction of the piping in the mounted state.

12 Claims, 12 Drawing Sheets

UNIT : °C

| LOW TEMPERATURE CONTROL | R1 (0deg) | R2 (22.5deg) | R3 (45deg) | R4 (67.5deg) | R5 (90deg) | R6 (112.5deg) | R7 (135deg) | R8 (157.5deg) | R9 (180deg) | Ave (CIRCUM-FERENTIAL DIRECTION) | Max (CIRCUM-FERENTIAL DIRECTION) | Min (CIRCUM-FERENTIAL DIRECTION) | UNIFORMITY (%) |
|---|---|---|---|---|---|---|---|---|---|---|---|---|---|
| A1 (150mm) | 141.8 | 143.3 | 145.9 | 143.8 | 141.3 | 143.3 | 146.1 | 143.9 | 141.6 | 143.4444 | 145.9 | 141.3 | 1.603% |
| A2 (85mm) | 142 | 142.5 | 144.3 | 142.2 | 140.2 | 141.6 | 144.2 | 142.3 | 141.5 | 142.3111 | 144.3 | 140.2 | 1.441% |
| A3 (20mm) | 141 | 144.3 | 146.1 | 143.3 | 140.5 | 142.9 | 143.1 | 141.3 | 140.4 | 142.5444 | 146.1 | 140.4 | 1.999% |
| A4 (JOINT SURFACE) | --- | --- | --- | --- | --- | --- | 143.9 | --- | --- | --- | --- | --- | --- |
| Ave (AXIAL DIRECTION) | --- | --- | --- | --- | --- | --- | 144.325 | --- | --- | | | | |
| Max (AXIAL DIRECTION) | --- | --- | --- | --- | --- | --- | 146.1 | --- | --- | | | | |
| Min (AXIAL DIRECTION) | --- | --- | --- | --- | --- | --- | 143.1 | --- | --- | | | | |
| UNIFORMITY (%) | --- | --- | --- | --- | --- | --- | 1.039% | --- | --- | | | | |

FIG.8B

UNIT: °C

| HIGH TEMPERATURE CONTROL | R1 (0deg) | R2 (22.5deg) | R3 (45deg) | R4 (67.5deg) | R5 (90deg) | R6 (112.5deg) | R7 (135deg) | R8 (157.5deg) | R9 (180deg) | Ave (CIRCUM-FERENTIAL DIRECTION) | Max (CIRCUM-FERENTIAL DIRECTION) | Min (CIRCUM-FERENTIAL DIRECTION) | UNIFORMITY (%) |
|---|---|---|---|---|---|---|---|---|---|---|---|---|---|
| A1 (150mm) | 183.6 | 186.7 | 189.3 | 185.5 | 182.9 | 185.2 | 187.5 | 185.3 | 182.4 | 185.4 | 189.3 | 182.4 | 1.861% |
| A2 (85mm) | 184.7 | 185.7 | 186.7 | 183.5 | 180.6 | 183.2 | 185.7 | 184.5 | 182.2 | 184.1 | 186.7 | 180.6 | 1.657% |
| A3 (20mm) | 182.8 | 185.2 | 186.5 | 182.4 | 179.8 | 181.9 | 183.5 | 182.1 | 180.5 | 182.7 | 186.5 | 179.8 | 1.834% |
| A4 (JOINT SURFACE) | --- | --- | --- | --- | --- | --- | 183.2 | --- | --- | --- | --- | --- | --- |
| Ave (AXIAL DIRECTION) | --- | --- | --- | --- | --- | --- | 185.0 | --- | --- | | | | |
| Max (AXIAL DIRECTION) | --- | --- | --- | --- | --- | --- | 187.5 | --- | --- | | | | |
| Min (AXIAL DIRECTION) | --- | --- | --- | --- | --- | --- | 183.2 | --- | --- | | | | |
| UNIFORMITY (%) | | | | | | | 1.162% | | | | | | |

HEATER FOR PIPING

CROSS REFERENCES AND INCORPORATION BY REFERENCE

This is a U.S. National Phase Application under 35 U.S.C. 371 of International Application PCT/JP2007/074645, filed on Dec. 21, 2007, which is incorporated herein by reference

BACKGROUND OF THE INVENTION

1. Field of the Invention

The present invention relates to a heater for piping in semiconductor manufacturing apparatuses and other manufacturing apparatuses, or chemical reaction processing apparatuses, etc.

2. Description of the Related Art

In semiconductor manufacturing apparatuses, chemical processing apparatuses, food product manufacturing apparatuses and other manufacturing apparatuses, heaters for piping are conventionally used to prevent solidification or deposition of a gas or liquid on inner walls of piping used for transferring the gas or liquid before processing and the gas or liquid after processing.

As heaters for piping, a contact heating-type heater for piping is known, where heating elements directly contact and heat the piping which is an object to be heated. Specific examples thereof include a jacket heater, which is fanned by embedding heating elements in a thermal insulator and a glass fabric, or the like, and is wound around the piping, a silicon rubber heater proposed in Japanese Unexamined Patent Publication No. 10 (1998)-134947 (Patent Document 1), which is formed by embedding heating elements in a silicon resin, or the like, and is wound around the piping.

Further, a non-contact heating-type heater for piping is known, where heating elements do not directly contact the piping, and a desired space is provided between the piping and the heating elements so that the piping is heated by radiation heat from the heating elements and thermal conduction by the air within the space. As a specific example, a heater for piping proposed in Japanese Unexamined Patent Publication No. 9 (1997)-017555 (Patent Document 2) includes metal plates having planar heaters attached on the outer surfaces thereof, where the metal plates form a space which is larger than the piping to enclose the piping.

With the jacket heater or the heater for piping disclosed in Patent Document 1, however, the heated piping may have temperature variation due to the positioning of the heating elements, as well as the winding position, uneven winding and uneven adhesion of the heater on the piping. Therefore, uniformity of heating of the piping is influenced by the level of skill of a worker who mounts the heater on the piping.

In addition, the jacket heater may influence cleanness of the environment in which the jacket heater is used due to dust generated from the glass fabric, etc., and the heater for piping disclosed in Patent Document 1 may cause corrosion of metal portions of the piping due to siloxane which generates from the use of the silicon resin, etc. Therefore, it is said to be necessary to consider the environment in which theses types of heaters are used.

With the heater for piping disclosed in Patent Document 2, the planar heaters do not directly contact the piping, and the piping is heated by thermal conduction by the air within the space formed between the metal plates, which are heated by the planar heaters, and the piping. Therefore, the temperature variation of the piping due to positioning of the planar heaters is reduced. However, the structure of this heater keeps a large space between the metal plates and the piping, and this results in large sizes of the parts, which may influence work efficiency during transport and mounting.

Further, during maintenance of the piping, it may be difficult to reproduce the heating performance of the heater for piping when the heater is mounted again.

SUMMARY OF THE INVENTION

In view of the above-described circumstances, the present invention is directed to providing a heater for piping, which can uniformly heat the piping to a desired constant temperature while improving work efficiency during transport and mounting and repeatability of mounting.

In order to solve the above-described problems, the heater for piping according to the invention includes: a plurality of shells connected via hinges, the shells being adapted to be mounted on an outer circumferential wall of piping having a circular cross section to enclose the piping and form a polyhedron along the piping; thermal insulators disposed over entire surfaces of inner walls of the shells; a plurality of molds disposed at the inner walls and adapted to abut on the outer circumferential wall in a mounted state; and a plurality of heating elements disposed to be positioned in a space formed between corners of the polyhedron and the outer circumferential wall and to extend in a longitudinal direction of the piping in the mounted state.

The "cross section" herein refers to a plane perpendicular to the longitudinal direction of the piping. The "circular" herein is not necessarily a mathematically strict circle, and includes ellipsoid, and the like. The "polyhedron" herein refers to a three dimensional shape enclosed by a plurality of faces and having a polygonal cross section, where all the side faces are rectangular or square. The "inner walls" herein refers to inner walls of the shells facing the outer circumferential wall of the piping. The "entire surfaces" herein means substantially the entire surfaces of the inner walls, and does not strictly mean the entire surfaces of the inner walls. The "thermal insulator" herein includes those of jacket heater type, silicon type, mica type, and clean block type which is impregnated with a heat-resistant resin. In particular, a clean block type thermal insulator is preferred when the heater is applied to a site where a clean environment is required, such as those involving semiconductor devices. The "corner" herein refers to a portion where the adjacent inner walls intersect with each other in the mounted state and an area in the vicinity of the portion.

In the invention, the molds may be disposed at the inner walls so that they are positioned nearest to the outer circumferential wall in the mounted state, i.e., each mold may be disposed in the vicinity of the center in the width direction of the inner wall of each shell forming the side faces of the polyhedron.

In the invention, each mold may be disposed integrally with each heating element at the inner wall and the molds may be in the vicinity of the corners in the mounted state.

The description "integrally with each heating element" does not necessarily means that the entire part of the heating element is integral with the mold. Practically, it suffices that a part of the heating element is integral with the mold.

In the invention, the shells may be connected via the hinges so that outer walls of the adjacent shells open outward with a limit angle therebetween and mating faces of the adjacent shells close inward with abutting on each other.

The "adjacent shells" herein refers to the shells next to each other which are connected via the hinges. The "outer walls" herein refers to surfaces of the shells opposite to the inner walls thereof. The term "outward" herein refers to a direction in which the outer walls of the adjacent shells are brought closer to each other. The "limit angle" herein means an angle formed outward between the outer walls of the adjacent shells when the outer walls open outward so that the outer walls do not hit each other. The limit angle formed between the outer walls of the adjacent shells is desirably in the range from 60 degrees to 180 degrees. The description "mating faces abutting on each other" herein means that the mating faces are brought closer to an extent that the ends of the adjacent shells contact each other, which does not mean strict contact. The term "inward" herein refers to a direction in which the inner walls of the adjacent shells are brought closer to each other.

In the invention, the shells may include draw latches, which serve to hold the polyhedron shape when they are locked.

EFFECT OF THE INVENTION

According to the invention, the heater for piping includes a plurality of shells connected via hinges to form a polyhedron along a piping in a mounted state on the outer circumferential wall of the piping having a circular cross section, thermal insulators disposed over entire surfaces of inner walls of the shells, a plurality of molds disposed at the inner walls and adapted to abut on the outer circumferential wall in the mounted state, and a plurality of heating elements disposed to be positioned in a space formed between corners of the polyhedron and the outer circumferential wall and to extend in the longitudinal direction of the piping in the mounted state.

Therefore, all the components of the heater for piping are adapted to form a polyhedron as a whole via the shells connected via the hinges. This improves work efficiency during transportation and mounting. Further, in the mounted state, the piping is enclosed with the molds disposed at the inner walls of the shells abutting on the outer circumferential wall of the piping. This improves stability of mounting, and thus the uniformity of heating of the piping is not influenced by the level of skill of a worker who mounts the heater on the piping, thereby always achieving stable and good heating. Moreover, the space between the corners of the polyhedron and the outer circumferential wall of the piping is formed uniformly and in a repeatable manner. This provides uniform heating of the piping by radiation heat from the plurality of heating elements disposed in the space and convection of the air in the space heated by the heating elements.

In addition, according to the invention, the thermal insulators serves to reduce temperature variation around the piping. Further, if the thermal insulators are formed by "clean blocks" impregnated with a heat-resistant resin, generation of dust can be reduced.

DESCRIPTION OF THE PREFERRED EMBODIMENTS

Hereinafter, embodiments of the present invention will be described with reference to the drawings.

Figure 1:
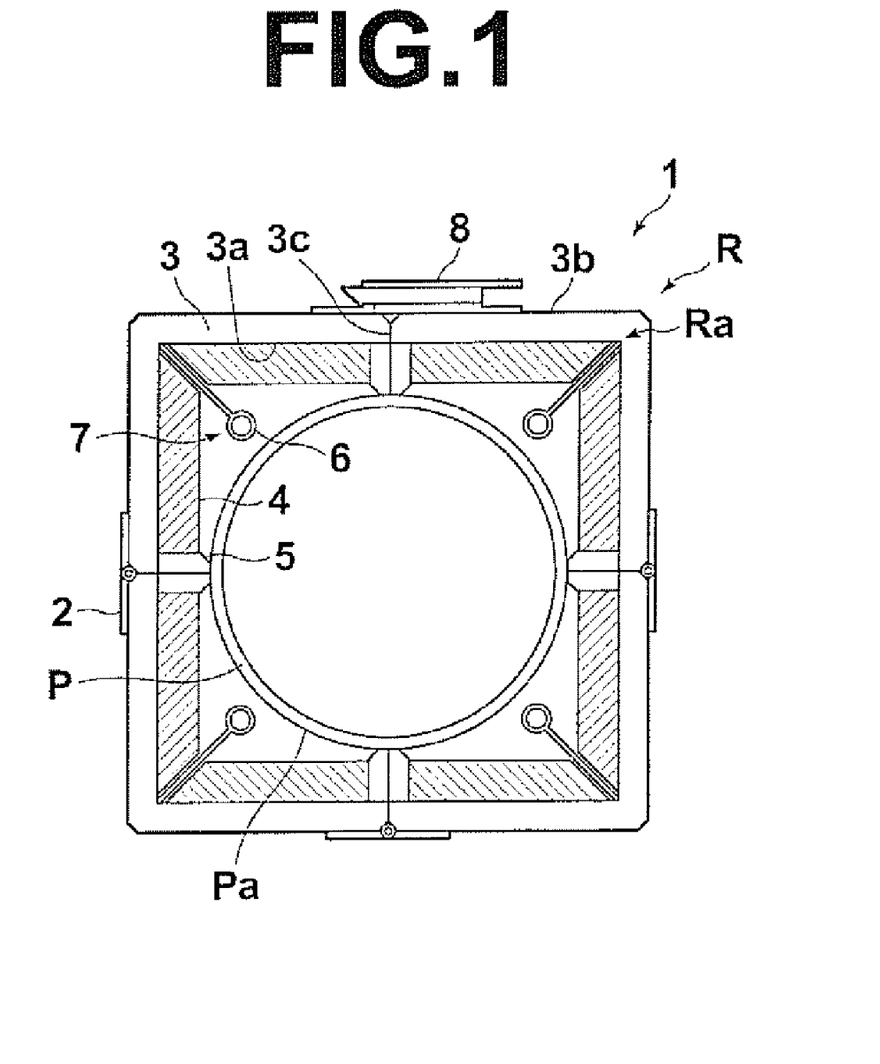
FIG. 1 is a diagram illustrating a cross section in a mounted state in a first embodiment of the invention.

A first embodiment of a heater for piping according to the invention is described with reference to FIGS. 1, 2A and 2B. FIG. 1 is a diagram illustrating a cross section in a mounted state in the first embodiment of the invention.

As shown in FIG. 1, in the first embodiment, four shells 3, each having an L-shaped cross section, are provided, which are connected via hinges 2. In the mounted state on an outer circumferential wall Pa of piping P, the four shells 3 form a cuboid R along the piping P. Each hinge 2 is able to open outward with a limit angle La (about 90 degrees in the example shown in the drawing), and the thickness of the shells 3 hinders each hinge 2 to close inward beyond the position where end faces of the adjacent shells 3 form an angle of 180 degrees therebetween, i.e., mating faces 3c, which will be described later, of the shells 2 abut each other (see FIG. 2B).

A plurality of thermal insulators 4 are disposed over the entire surfaces of inner walls 3a of the shells 3. Further, a plurality of molds 5 are disposed at the inner walls 3a along the longitudinal direction of the piping P such that, in the mounted state, the molds 5 abut on the outer circumferential wall Pa and are positioned nearest to the outer circumferential wall Pa. Further, four heating elements 6 are disposed at the inner walls 3a such that the heating elements 6 are positioned in spaces 7 formed between the outer circumferential wall Pa and corners Ra of the cuboid R formed by the shells 3 in the mounted state. It should be noted that the heating elements 6 are not necessarily positioned in the spaces 7 formed between the outer circumferential wall Pa and all the corners Ra, and the number of the heating elements 6 may be reduced depending on the diameter of the piping P and the costs.

Draw latches 8 are disposed on outer walls 3b of the shells 3 on the upper side in the drawing. When the draw latches 8 are locked, the adjacent shells 3 on the upper side in the drawing are secured to each other, and the heater 1 for piping is mounted on the outer circumferential wall Pa of the piping P. When the draw latches 8 are locked, the molds 5 in the mounted state apply a pressure to the outer circumferential wall Pa of the piping P, and thus a clearance between the mating faces 3c of the adjacent shell 3 is about 0.5 mm or less.

Next, an unmounted state in the first embodiment of the invention is described. FIGS. 2A and 2B are diagrams illustrating a cross section in the unmounted state in the first embodiment of the invention. FIG. 2A shows a cross section in the unmounted state where the draw latches 8 are unlocked, and FIG. 2B shows a cross section in the unmounted state where the draw latches 8 are locked.

Figure 2A:
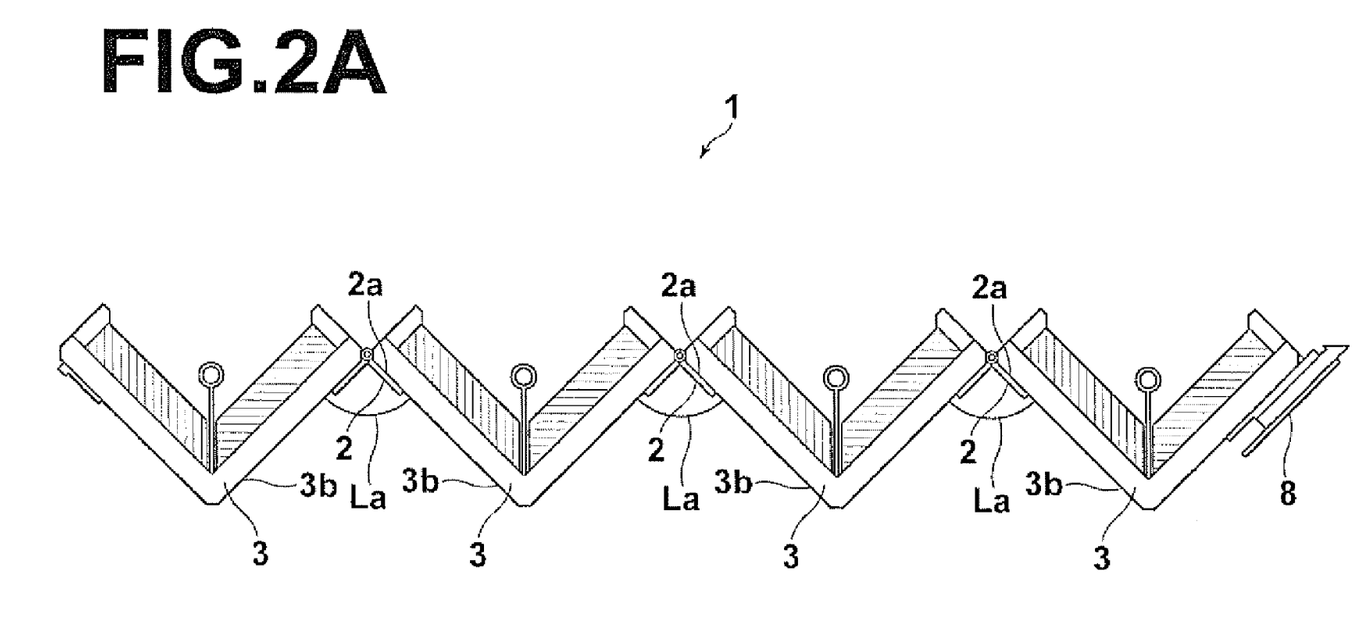
FIG. 2A is a diagram illustrating a cross section in an unmounted state in the first embodiment of the invention.

As shown in FIG. 2A, in the first embodiment, even when the draw latches 8 are unlocked, all the parts of the heater 1 for piping are united together. Further, the hinges 2 are disposed so that openable surfaces 2a thereof face the outer walls 3b of the shells 3. Therefore, when the draw latches 8 are unlocked, the adjacent shells 3 do not open beyond the predetermined limit angle La. Specifically, as shown in FIG. 2A, the limit angle between the outer walls 3b of the adjacent shells 3 is around 90 degrees.

Figure 2B:
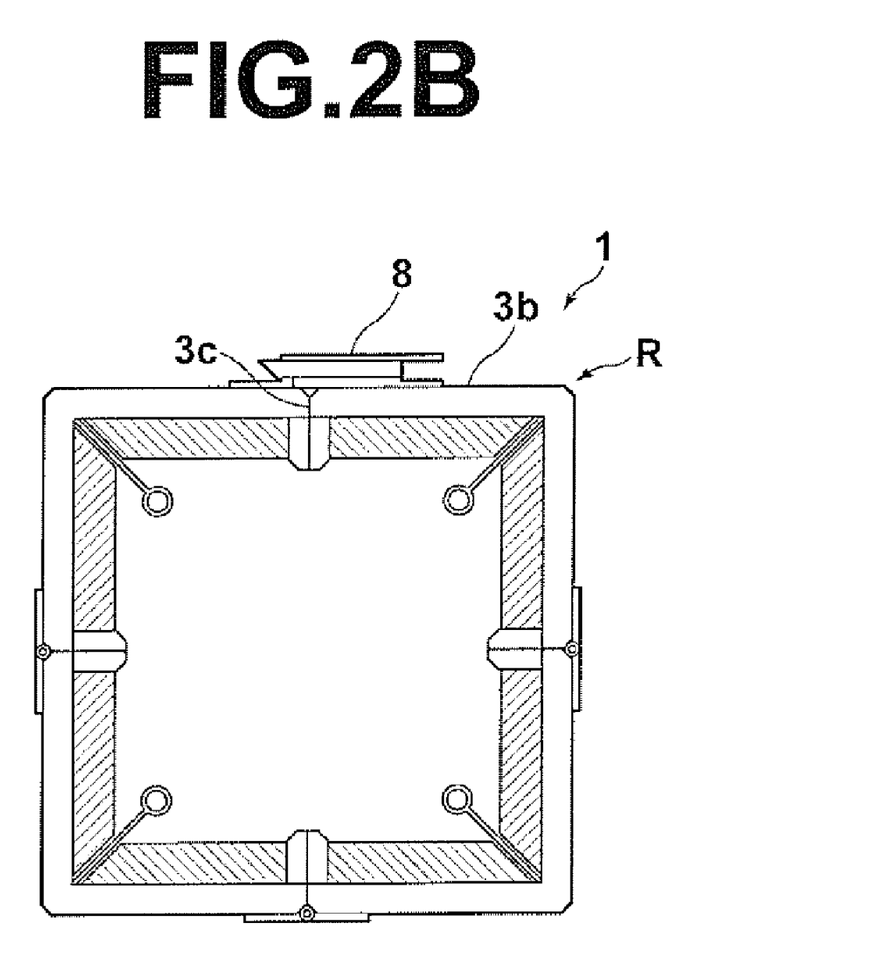
FIG. 2B is a diagram illustrating a cross section in an unmounted state in the first embodiment of the invention.

Further, as shown in FIG. 2B, in the first embodiment, the draw latches 8 are disposed on the outer walls 3b to extend via the mating faces 3c of the adjacent shells 3, so that the shape of the cuboid R is maintained when the draw latches 8 are locked in the unmounted state of the piping P.

Figure 3A:
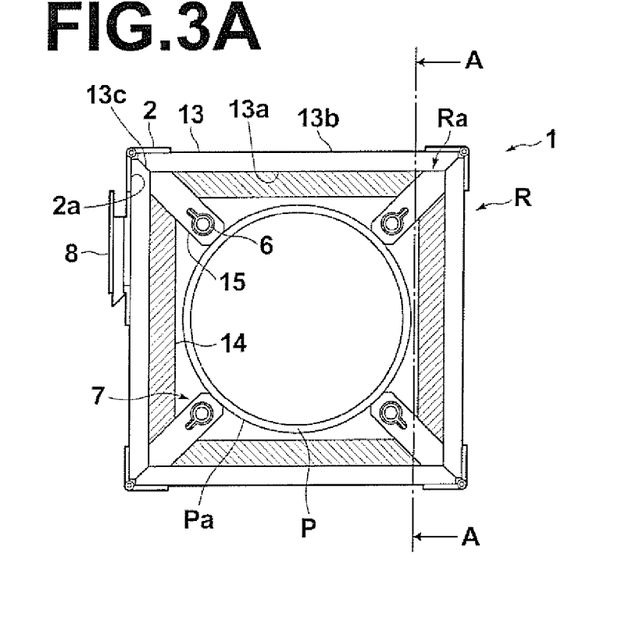
FIG. 3A is a diagram illustrating a second embodiment of the invention.
Figure 3B:
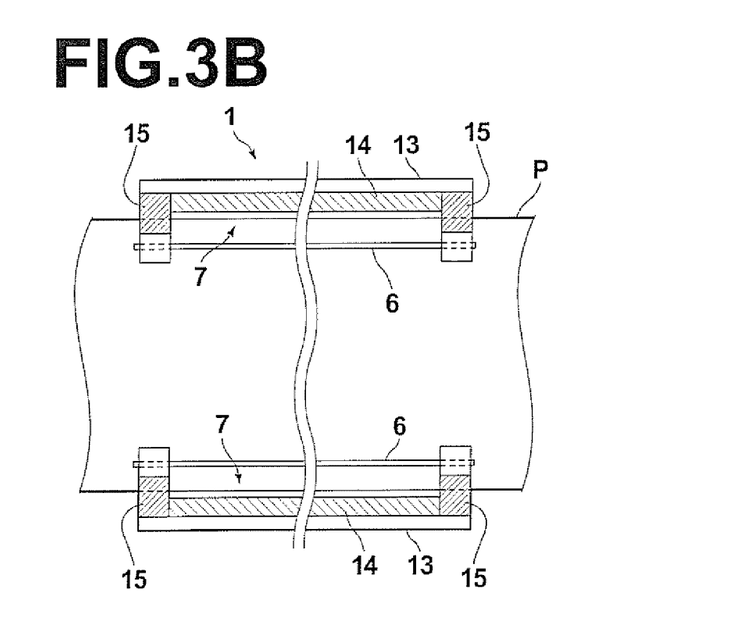
FIG. 3B is a diagram illustrating the second embodiment of the invention.
Figure 3C:
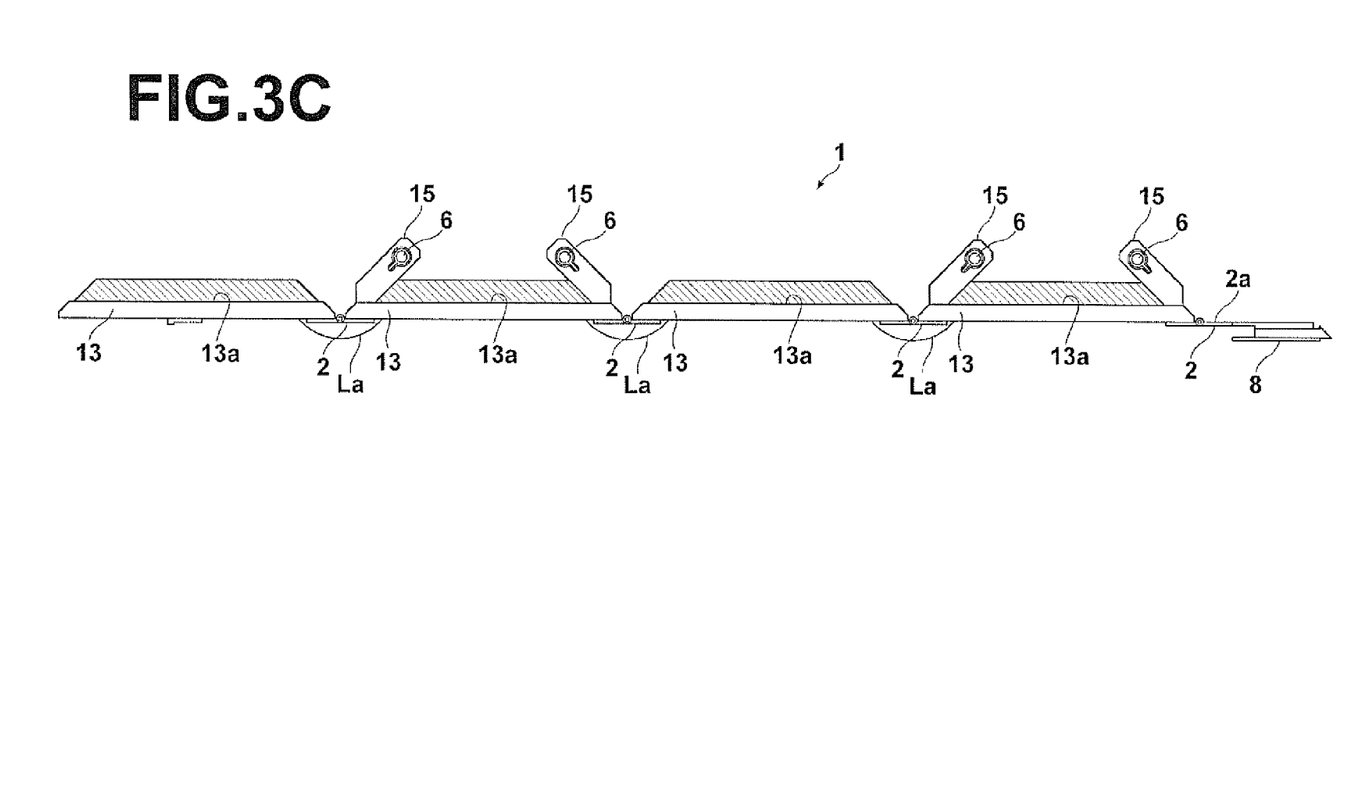
FIG. 3C is a diagram illustrating the second embodiment of the invention.

Next, a second embodiment of the heater for piping according to the invention is described. FIGS. 3A and 3B are diagrams illustrating the second embodiment of the invention. FIG. 3A shows a cross section in the mounted state in the second embodiment, FIG. 3B shows the right side in a cross section taken along line A-A in FIG. 3A in the second embodiment, and FIG. 3C shows a state where the draw latches 8 are unlocked in the unmounted state in the second embodiment. It should be noted that a part that has the same structure as that in the first embodiment is denoted by the same symbol in the description.

As shown in FIG. 3A, in the second embodiment, four flat shells 13 are provided, which are connected via the hinges 2. Similarly to the first embodiment, in the mounted state on the outer circumferential wall Pa of the piping P, the four shells 13 form the cuboid R along the piping P.

Similarly to the first embodiment, a plurality of thermal insulators 14 are disposed over the entire surfaces of inner walls 13a of the shells 13. Further, molds 15 are disposed at opposite ends of each of the inner walls 13a of two shells 13, which alternate with the shells 13 having only the thermal insulator 14 disposed on the inner wall 13a thereof, as shown in FIG. 3C. The molds 15 on each inner wall 13a extend from the inner wall 13a with being inclined in opposite directions from each other at an angle of about 45 degrees relative to the inner wall 13a, so that, in the mounted state, the molds 15 abut on the outer circumferential wall Pa and are positioned in the vicinity of the corners Ra of the formed cuboid R.

An end of each draw latch 8 is welded to an end of the hinge 2 disposed on the outer wall 13b of the shell 13 on the right side in FIG. 3C, and one of the openable surfaces 2a of the hinge 2 to which the draw latch 8 is welded is not secured to the outer wall 13b of the shell 13. Thus, when the draw latches 8 are unlocked, mating faces 13c of the shell 13 on which this hinge 2 (on the upper-left side in the drawing) is disposed and of the adjacent shell 13 are separated. In the second embodiment, the adjacent shells 13 are connected via the hinges 2 disposed at positions corresponding to the corners of the cuboid R, and each hinge 2 is closable inward to form an angle of 90 degrees therebetween until the adjacent shells 13 abut with each other at the mating faces 13c, which are inclined at an angle of 45 degrees relative to the adjacent shells 13.

As shown in FIG. 3B, each mold 15 supports a part of the heating element 6 and is secured to the inner wall 13a. Thus, in the mounted state, each heating element 6 is positioned between each corner Ra and the outer circumferential wall Pa, and spaces 7 are present between the outer circumferential wall Pa and portions of the heating elements 6 which are not supported by the molds 15. Although each heating element 6 is supported by the two molds 15 in this embodiment, this is not intended to limit the invention.

In the second embodiment, a distance between each heating element 6 and the molds 15 is smaller than that in the first embodiment. This reduces temperature drop due to thermal conduction of the outer wall Pa at positions where the molds 15 abut. It should be noted that operations when the latches 8 are locked and unlocked in the unmounted state are the same as those in the first embodiment, and explanations thereof are omitted.

Further, although the polyhedron is described as the cuboid R in the first and second embodiments, this is not intended to limit the invention. the polyhedron may have a triangular, hexagonal or octagonal cross section, for example, depending on the diameter of the piping P.

Figure 4:
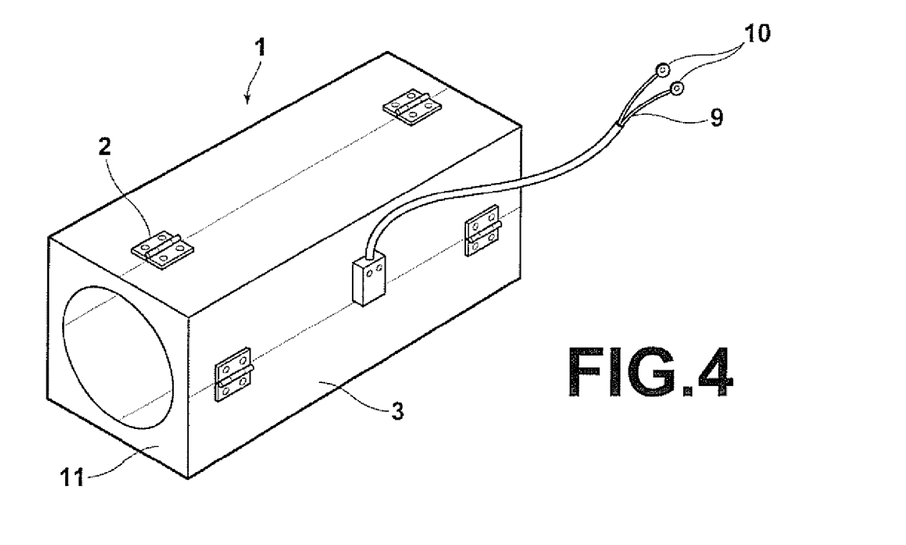
FIG. 4 is a perspective view of a heater 1 for piping of the invention.

Next, wiring to the heating elements of the heater 1 for piping of the invention is described. FIG. 4 is a perspective view of the heater 1 for piping of the invention. As shown in FIG. 4, a power feeding cable 9 extends from the shell 3, and two round terminals 10 are attached through crimping at tips of the cable 9.

The power feeding cable 9 is insert molded in the shell 3 and is connected to each heating element 6 (the state of connection is not shown in the drawing). It should be noted that wiring of the power feeding cable 9 in the shell 3 may be series wiring or parallel wiring depending on the required capacity of each heating element 6. Further, wiring to an unused heating element, if any, may be omitted, as necessary.

Further, partition plates 11, which form joint surfaces, are disposed at opposite sides of the heater 1 for piping of the invention. It should be noted that the power feeding cable 9 and the partition plates 11 are common components in the first and second embodiments.

Figure 5:
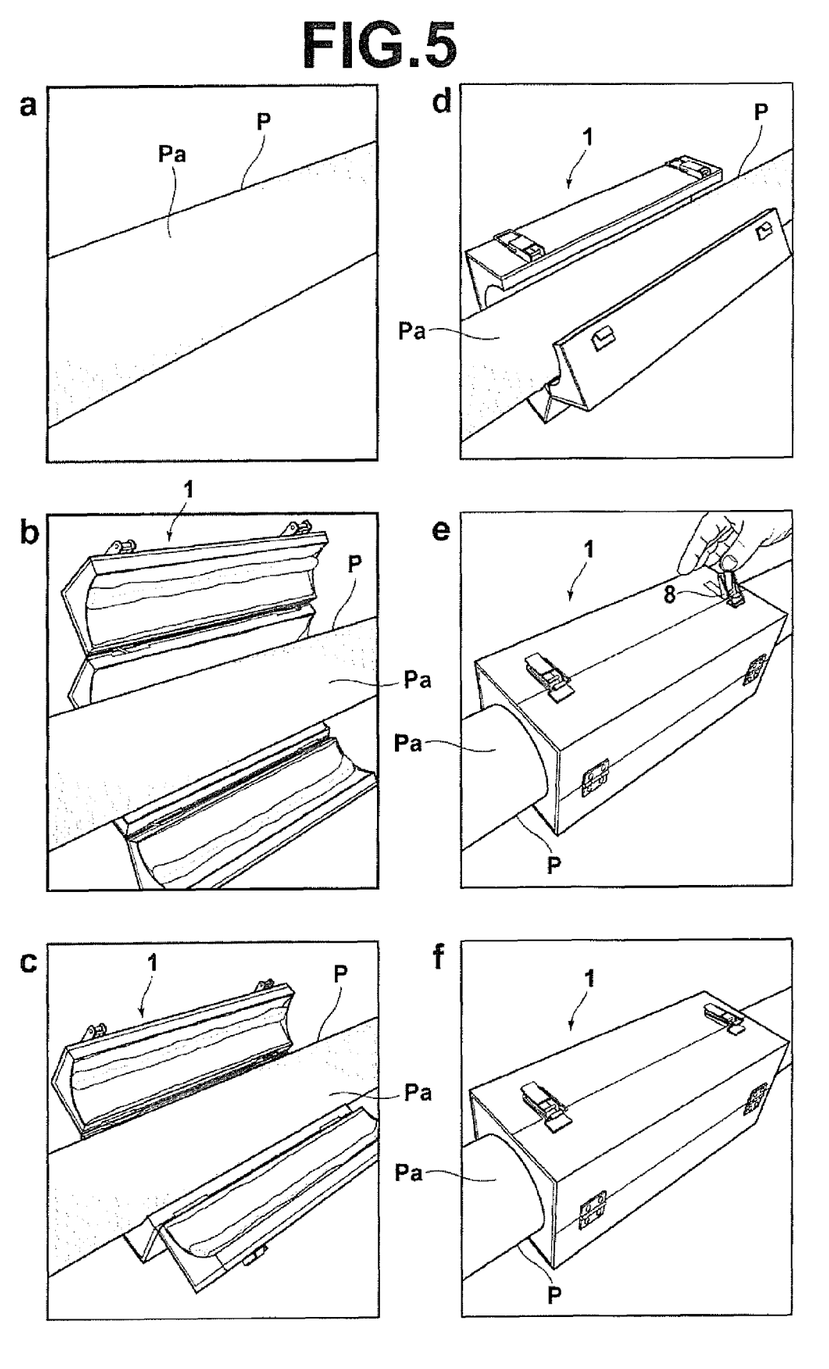
FIG. 5 is a diagram illustrating an operation to mount the heater 1 for piping of the invention on piping P.

Next, how the heater 1 for piping of the invention is mounted on the piping P is described. FIG. 5 is a diagram illustrating an operation to mount the heater 1 for piping of the invention on the piping P. FIG. 5 shows at "a" to "f" a process of the operation to mount the heater 1 for piping according to the first embodiment of the invention on the piping P.

As shown in FIG. 5, at a desired heating position of the piping P, the outer circumferential wall Pa is covered in a state where the draw latches 8 are unlocked, and then, the draw latches 8 are locked to finish the mounting operation on the piping P. Thus, a high skill level of the worker is not required in the mounting operation, and the operation can be done in a short time. Further, the heater 1 for piping can be transported to a working site in the state shown in FIG. 2B, and this improves work efficiency during transportation.

Figure 6:
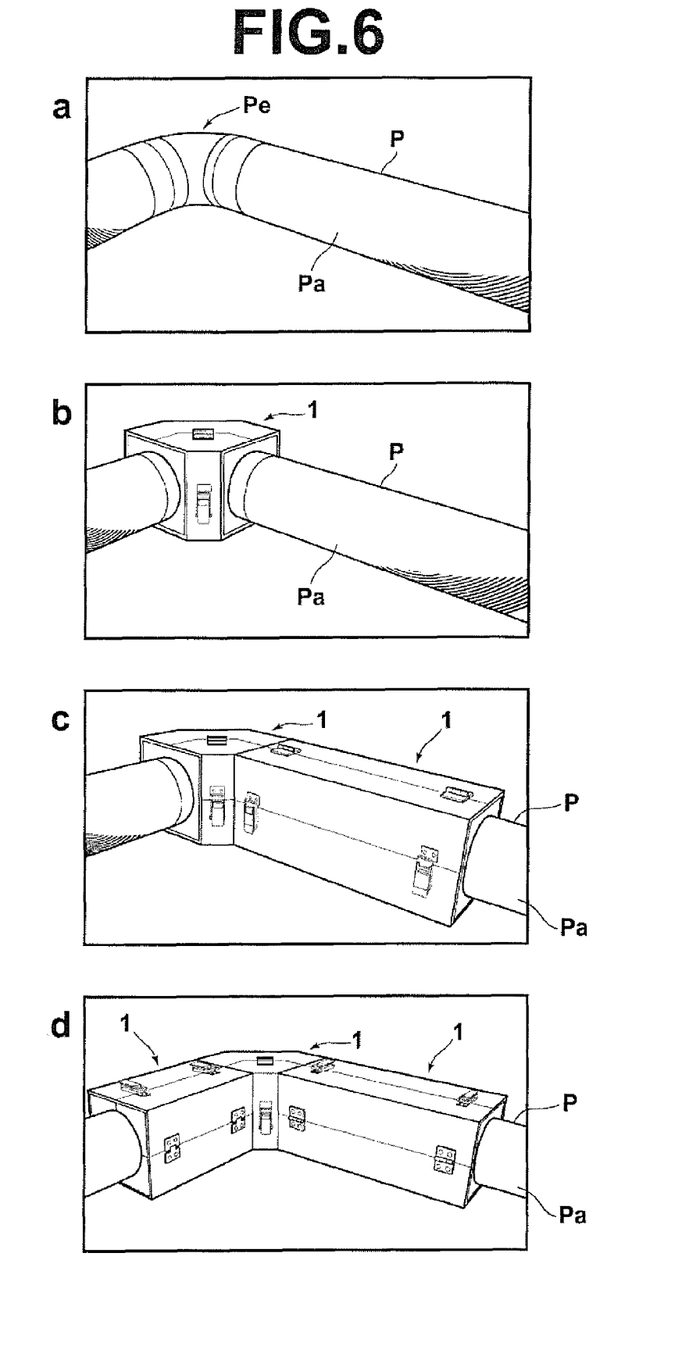
FIG. 6 is a diagram illustrating connection of the heater 1 for piping of the invention.

Next, connection of the invention heater for piping is described. FIG. 6 is a diagram illustrating connection of the heater 1 for piping of the invention. FIG. 6 shows at "a" to "d" a process of mounting the heater 1 for piping of the invention on the piping P having an elbow Pe.

When the heater 1 for piping of the invention is mounted on the piping P having the elbow Pe, as shown at "a" in FIG. 6, the heater 1 for piping corresponding to the elbow Pe, as shown at "b" in FIG. 6, is prepared. Further, depending on the piping length of the piping P, the heaters 1 for piping having various lengths in the longitudinal direction of the piping P are prepared, as shown at "c" and "d" in FIG. 6. Specifically, those corresponding to the piping lengths of 300 mm (on the right in the drawing) and 200 mm (on the left in the drawing) can be prepared; however, this is not intended to limit the invention. As shown at "d" in FIG. 6, by connecting these heaters 1 for piping, a desired area of the piping P having the elbow Pe can be heated. If the piping P has a projection, such as an valve (not shown), a bypassing hole, or the like, for bypassing the projection can be provided in the shell 3.

Figure 7A:
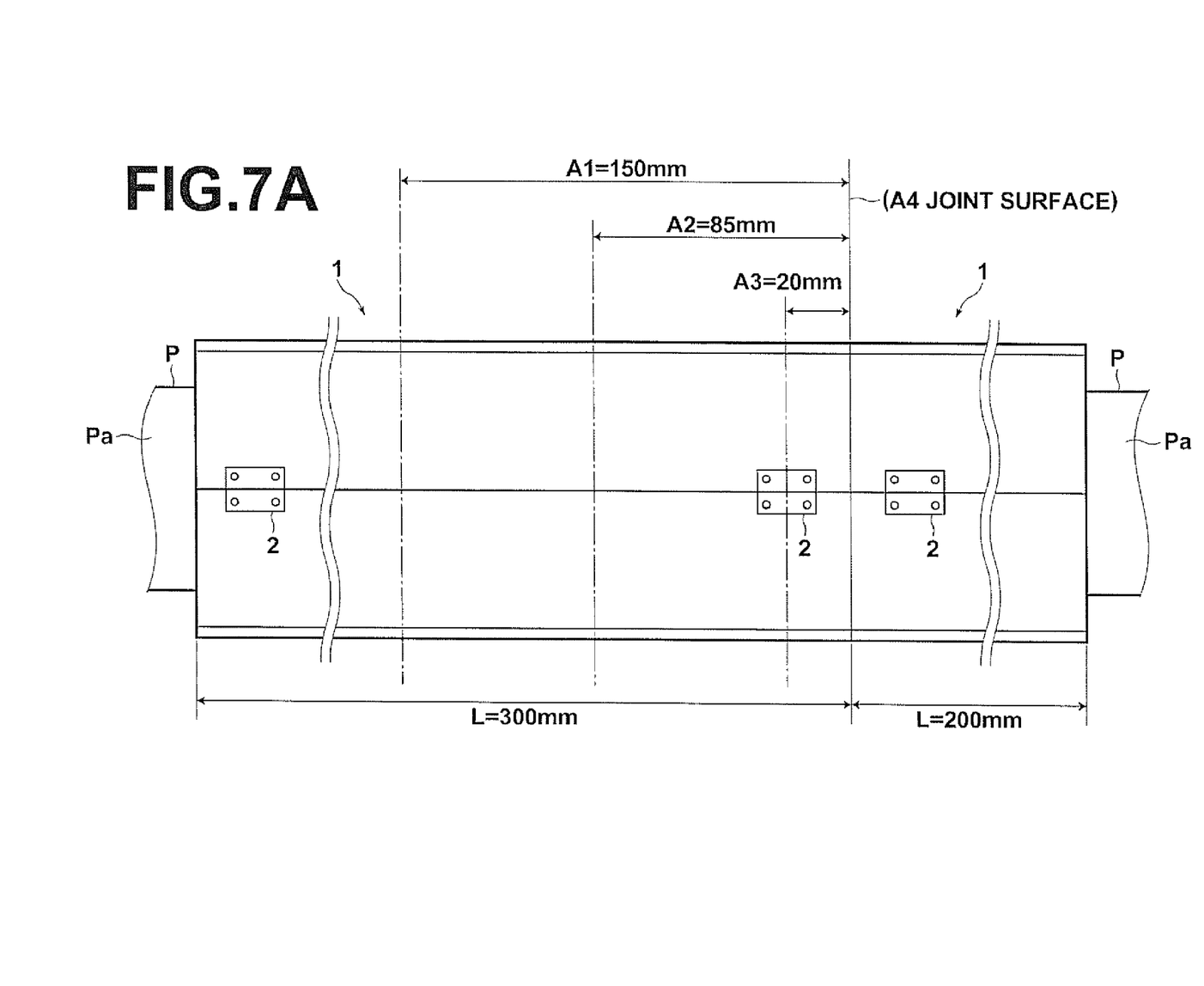
FIG. 7A is a diagram illustrating measurement points for measuring heating performance of the heater 1 for piping of the invention.
Figure 7B:
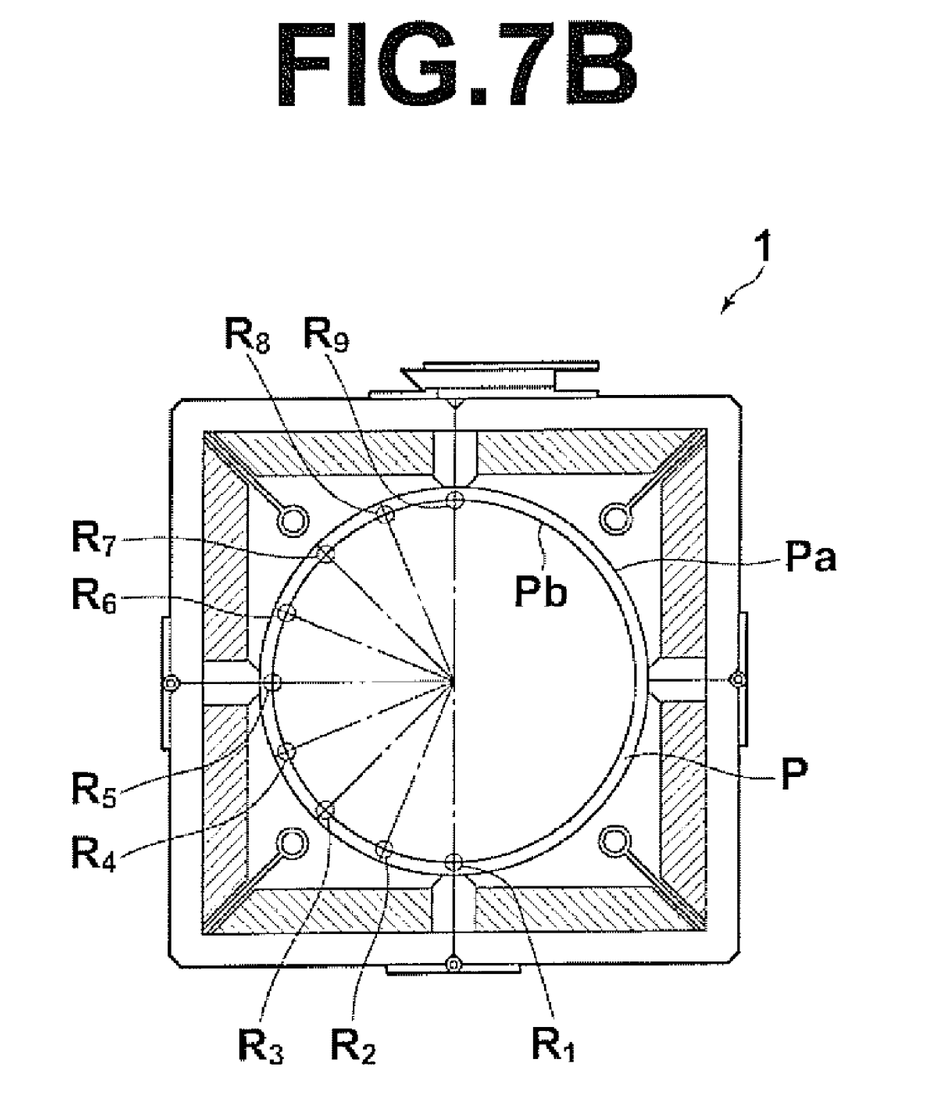
FIG. 7B is a diagram illustrating measurement points for measuring heating performance of the heater 1 for piping of the invention.

Next, heating performance of the heater 1 for piping of the invention is described. FIGS. 7A and 7B are diagrams illustrating measurement points for measuring the heating performance of the heater 1 for piping of the invention. FIG. 7A shows measurement points in the axial direction of the heater 1 for piping, and FIG. 7B shows measurement points in the circumferential direction of the heater 1 for piping.

As shown in FIG. 7A, when the heating performance is measured, the heater 1 for piping corresponding to the piping length of 300 mm (on the left in the drawing) and the heater 1 for piping corresponding to the piping length of 200 mm (on the right in the drawing) are connected on the piping P. Then, a position A1 at a distance of 150 mm, a position A2 at a distance of 85 mm, and a position A3 at a distance of 20 mm in the axial direction from a joint surface A4 of the heater 1 for piping corresponding to 300 mm (on the left in the drawing) as well as the joint surface A4 are used as the measurement points in the axial direction.

As shown in FIG. 7B, when the heating performance is measured, a position R1 (0 degrees), a position R2 (22.5 degrees), a position R3 (45 degrees), a position R4 (67.5 degrees), a position R5 (90 degrees), a position R6 (112.5 degrees), a position R7 (135 degrees), a position R8 (157.5 degrees) and a position R9 (180 degrees), which are positioned at regular intervals of 22.5 degrees in clockwise in the circumferential direction from the lowermost part of the inner circumferential wall Pb of the piping P in the drawing, are used as the measurement points in the circumferential direction.

Figure 8A:
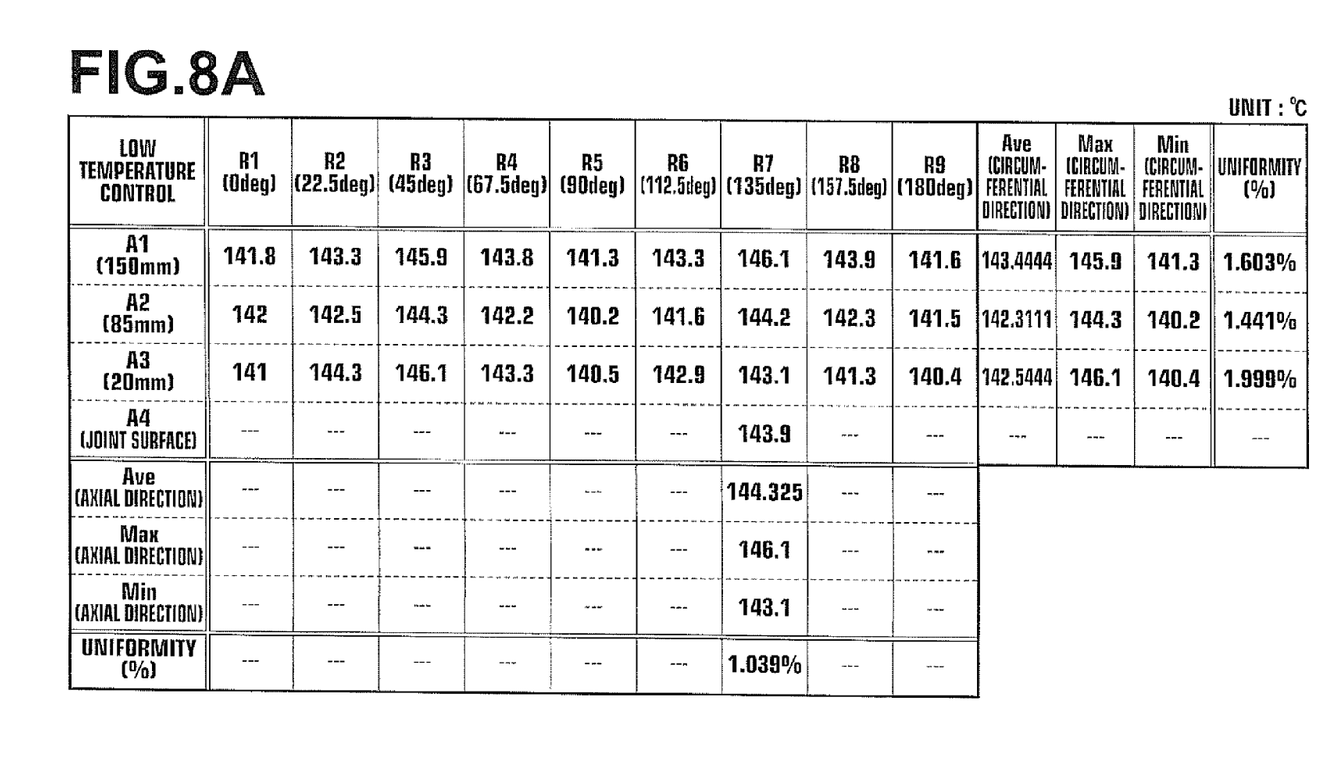
FIG. 8A shows measurement data of the heating performance of the heater 1 for piping of the invention.
Figure 8B:
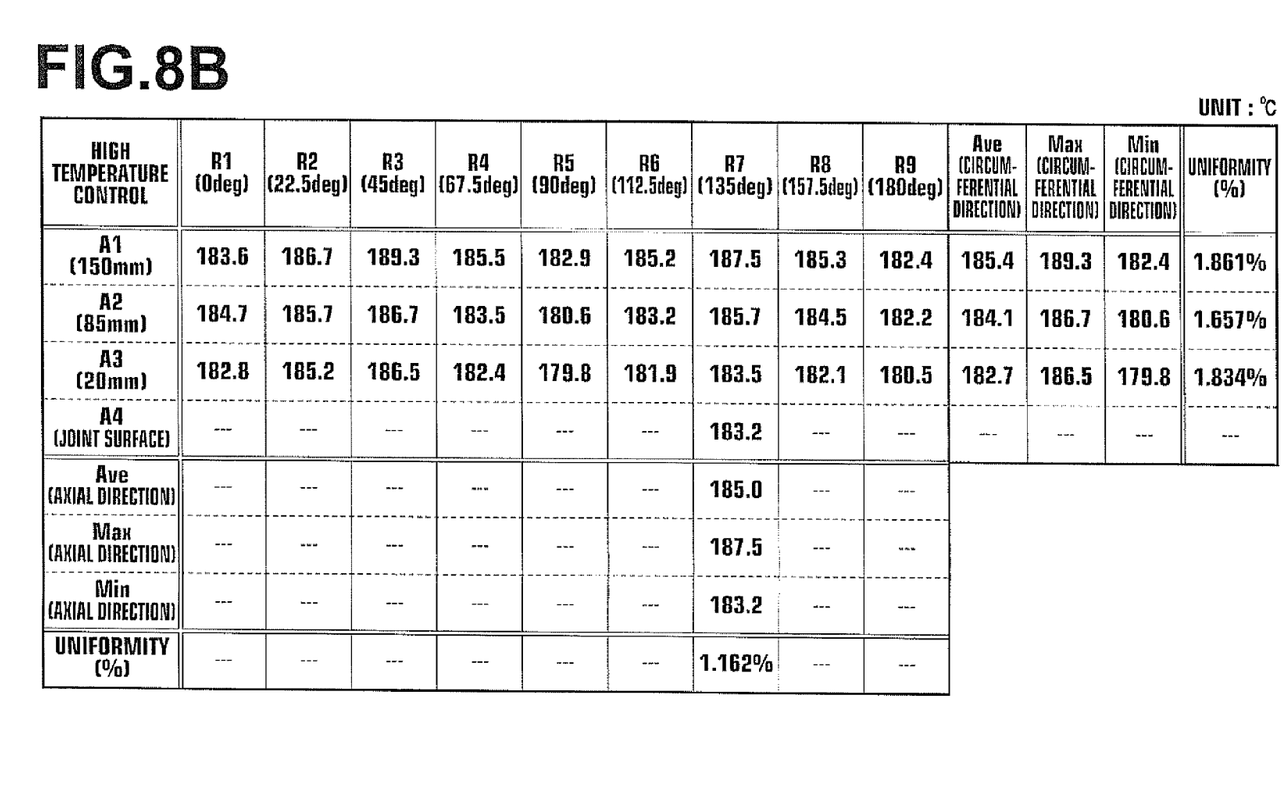
FIG. 8B shows measurement data of the heating performance of the heater 1 for piping of the invention.

Next, the heating performance of the heater 1 for piping of the invention measured at the above-described measurement points is described. FIGS. 8A and 8B show measurement data taken using the heater for piping of the invention. FIG. 8A shows measurement data taken in a case of low temperature control where the controlled temperature at the outer circumferential wall Pa of the piping P was 150° C., and FIG. 8B shows measurement data taken in a case of high temperature control where the controlled temperature at the outer circumferential wall Pa of the piping P was 190° C.

As the heater 1 for piping, the heaters 1 for piping corresponding to the piping lengths of 300 mm and 200 mm were connected, as described above. As the piping P, which is the object to be heated, specifically a thin stainless steel pip 80A (t=3 mm, SUS304) was used. Further, K thermocouple (sheath type with a diameter of 1 mm) was used as a sensor for measuring temperature, TCM series (manufactured by Tokyo Technological Labo Co., Ltd.) was used as a PID control instrument, and GL450 (manufactured by Graphtec) was used as a data logger to carry out measurement.

In FIGS. 8A and 8B, an evaluation index indicating the heating performance at each measurement point of the heater 1 for piping is defined as: uniformity (%)=(highest temperature−lowest temperature)/(2×average temperature)×100. As shown in FIGS. 8A and 8B, in both the cases of high temperature control and low temperature control of the piping P, the uniformity index of about 2% or less was maintained at the measurement points in the axial direction and in the circumferential direction.

According to the heater 1 for piping of the invention, the molds 5 apply a pressure to the outer circumferential wall Pa in the mounted state. This improves stability of mounting without requiring high skill level of the worker, and provides repeatability to provide sufficiently small clearance between the adjacent shells 3. Further, in the unmounted state, the cuboid R is maintained in the locked state, and this improves work efficiency during transportation. In the unlocked state, the limit angle is provided for the shells 3 when they are open, and this improves work efficiency during mounting. Moreover, the piping P is heated by radiation heat from the heating elements 6 disposed in the spaces 7 between the corners Ra and the outer circumferential wall Pa and convection of the air in the spaces 7. This reduces influence of positioning error of the heating elements 6 in the spaces 7, and allows maintaining the temperature of the piping P with sufficient uniformity.

The invention claimed is:

1. A heater for piping, the heater comprising:
 a plurality of shells connected via hinges, the shells being adapted to be mounted on an outer circumferential wall of piping having a circular cross section to enclose the piping and form a polyhedron along the piping;
 thermal insulators disposed over entire surfaces of inner walls of the shells and the thermal insulators remote from outer circumferential wall when the heater is mounted on the piping;
 a plurality of molds disposed at the inner walls and adapted to abut on the outer circumferential wall in a mounted state; and
 a plurality of heating elements disposed to be positioned in a space formed between corners of the polyhedron and the outer circumferential wall and to extend in a longitudinal direction of the piping in the mounted state, the plurality of heating elements remote from the thermal insulators and remote from the outer circumferential wall when the heater is mounted on the piping.

2. The heater for piping as claimed in claim 1, wherein the molds are disposed at the inner walls nearest to the outer circumferential wall in the mounted state.

3. The heater for piping as claimed in claim 1, wherein each mold is disposed integrally with each heating element at the inner wall and the molds are in the vicinity of the corners in the mounted state.

4. The heater for piping as claimed in claim 1, wherein the shells are connected via the hinges so that outer walls of the adjacent shells open outward with a limit angle therebetween and mating faces of the adjacent shells close inward with abutting on each other.

5. The heater for piping as claimed in claim 1, wherein the shells comprise draw latches, the draw latches serving to hold the polyhedron shape when the draw latches are locked.

6. The heater for piping as claimed in claim 1, wherein the thermal insulators are impregnated with a heat-resistant resin.

7. The heater for piping as claimed in claim 2, wherein the shells are connected via the hinges so that outer walls of the adjacent shells open outward with a limit angle therebetween and mating faces of the adjacent shells close inward with abutting on each other.

8. The heater for piping as claimed in claim 2, wherein the shells comprise draw latches, the draw latches serving to hold the polyhedron shape when the draw latches are locked.

9. The heater for piping as claimed in claim 2, wherein the thermal insulators are impregnated with a heat resistant resin.

10. The heater for piping as claimed in claim 3, wherein the shells are connected via the hinges so that outer walls of the adjacent shells open outward with a limit angle therebetween and mating faces of the adjacent shells close inward with abutting on each other.

11. The heater for piping as claimed in claim 3, wherein the shells comprise draw latches, the draw latches serving to hold the polyhedron shape when the draw latches are locked.

12. The heater for piping as claimed in claim 3, wherein the thermal insulators are impregnated with a heat-resistant resin.

* * * * *

UNITED STATES PATENT AND TRADEMARK OFFICE
CERTIFICATE OF CORRECTION

PATENT NO.       : 8,378,264 B2                                    Page 1 of 1
APPLICATION NO.  : 12/809422
DATED            : February 19, 2013
INVENTOR(S)      : Nomoto et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 353 days.

Signed and Sealed this
First Day of September, 2015

Michelle K. Lee
*Director of the United States Patent and Trademark Office*